(12) United States Patent
Donovan et al.

(10) Patent No.: US 8,793,085 B2
(45) Date of Patent: Jul. 29, 2014

(54) CIRCUITS AND METHODS FOR AUTOMATICALLY ADJUSTING A MAGNETIC FIELD SENSOR IN ACCORDANCE WITH A SPEED OF ROTATION SENSED BY THE MAGNETIC FIELD SENSOR

(75) Inventors: Mark J. Donovan, Derry, NH (US); Michael C. Doogue, Manchester, NH (US); Ryan Metivier, Nashua, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 329 days.

(21) Appl. No.: 13/213,406

(22) Filed: Aug. 19, 2011

(65) Prior Publication Data

US 2013/0046488 A1 Feb. 21, 2013

(51) Int. Cl.
*G06F 19/00* (2011.01)

(52) U.S. Cl.
USPC ..... 702/57; 702/145; 324/207.2; 324/207.21; 428/611; 428/815

(58) Field of Classification Search
USPC ............. 702/115, 116, 117, 57, 189, 182; 324/117 R, 166, 252; 428/811.2, 611, 428/637, 660, 686, 213, 692, 692.1; 360/324, 324.12, 324.2
See application file for complete search history.

(56) References Cited

U.S. PATENT DOCUMENTS

| | | | |
|---|---|---|---|
| 4,668,914 A | 5/1987 | Kersten et al. | |
| 4,761,569 A | 8/1988 | Higgs | |
| 4,829,352 A | 5/1989 | Popovic et al. | |
| 5,027,648 A | 7/1991 | Filleau | |
| 5,541,506 A | 7/1996 | Kawakita et al. | |
| 5,572,058 A | 11/1996 | Biard | |
| 5,612,618 A | 3/1997 | Arakawa | |
| 5,619,137 A | 4/1997 | Vig et al. | |
| 5,621,319 A | 4/1997 | Bilotti et al. | |
| 5,657,189 A | 8/1997 | Sandhu | |
| 5,694,038 A | 12/1997 | Moody et al. | |
| 5,831,513 A | 11/1998 | Lue | |
| 5,844,411 A | 12/1998 | Vogt | |
| 5,942,895 A | 8/1999 | Popovic et al. | |
| 6,064,199 A | 5/2000 | Walter et al. | |
| 6,064,202 A | 5/2000 | Steiner et al. | |
| 6,091,239 A | 7/2000 | Vig et al. | |

(Continued)

FOREIGN PATENT DOCUMENTS

DE 10 2005 014 509 B4 10/2006
DE 10 2006 037 226 A1 2/2008

(Continued)

OTHER PUBLICATIONS

PCT Search Report and Written Opinion of the ISA, dated Dec. 19, 2012; for PCT Pat. App. No. PCT/2012/049903; 14 sheets.

(Continued)

*Primary Examiner* — Carol S Tsai

(74) *Attorney, Agent, or Firm* — Daly, Crowley, Mofford & Durkee, LLP

(57) ABSTRACT

A magnetic field sensor and a method used therein provide a measured signal representative of an angular speed of rotation of a target object. The magnetic field sensor, in accordance with the measured speed of rotation, can automatically change various characteristics of the magnetic field sensor.

24 Claims, 6 Drawing Sheets

(56) References Cited

U.S. PATENT DOCUMENTS

| | | | |
|---|---|---|---|
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,687,644 B1 | 2/2004 | Zinke et al. | |
| 6,768,301 B1 | 7/2004 | Hohe et al. | |
| 6,872,467 B2* | 3/2005 | Qian et al. | 428/611 |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,075,290 B2* | 7/2006 | Collier-Hallman et al. | 324/163 |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,714,570 B2 | 5/2010 | Thomas et al. | |
| 7,746,065 B2 | 6/2010 | Pastre et al. | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 8,076,927 B2* | 12/2011 | Ausserlechner et al. | 324/207.21 |
| 8,508,218 B2* | 8/2013 | Reymond et al. | 324/207.2 |
| 2003/0057941 A1 | 3/2003 | Collier-Hallman et al. | |
| 2004/0115478 A1* | 6/2004 | Qian et al. | 428/692 |
| 2006/0011999 A1 | 1/2006 | Schott et al. | |
| 2007/0029998 A1 | 2/2007 | Popovic et al. | |
| 2009/0121707 A1 | 5/2009 | Schott | |
| 2009/0174395 A1 | 7/2009 | Thomas et al. | |
| 2010/0156397 A1 | 6/2010 | Yabusaki et al. | |
| 2010/0164491 A1 | 7/2010 | Kejik et al. | |
| 2010/0231202 A1 | 9/2010 | Scheller et al. | |
| 2010/0264909 A1 | 10/2010 | Scheller et al. | |
| 2011/0025313 A1 | 2/2011 | Zangl et al. | |
| 2011/0187350 A1* | 8/2011 | Ausserlechner et al. | 324/202 |
| 2011/0248708 A1 | 10/2011 | Thomas et al. | |
| 2012/0286773 A1* | 11/2012 | Reymond et al. | 324/207.2 |
| 2013/0238278 A1* | 9/2013 | Shoemaker et al. | 702/145 |

FOREIGN PATENT DOCUMENTS

| | | | |
|---|---|---|---|
| EP | 0 631 416 B1 | | 12/1994 |
| EP | 0 875 733 B1 | | 11/1998 |
| EP | 0 916 074 B1 | | 5/1999 |
| EP | 0 944 888 B1 | | 10/2001 |
| EP | 2 000 813 | | 12/2008 |
| EP | 2 000 814 | A2 | 12/2008 |
| EP | 2000813 | A1 * | 12/2008 |
| JP | 58-055688 | A | 4/1983 |
| JP | 2003-042709 | | 2/2003 |
| JP | 2005-241269 | | 9/2005 |
| JP | 2010-014607 | | 1/2010 |
| JP | 2010-078366 | | 4/2010 |
| JP | 2010 145293 | A | 7/2010 |
| WO | WO 98/10302 | | 3/1998 |
| WO | WO 98/54547 | | 12/1998 |
| WO | WO 00/02266 | | 1/2000 |
| WO | WO 03/036732 | A2 | 5/2003 |
| WO | WO 2004/025742 | A1 | 3/2004 |
| WO | WO 2006/056289 | A1 | 6/2006 |
| WO | WO 2006/074989 | A2 | 7/2006 |
| WO | WO 2008 145662 | A1 | 12/2008 |
| WO | WO 2009/124969 | A1 | 10/2009 |

OTHER PUBLICATIONS

PCT Search Report and Written Opinion of the ISA; dated Jan. 2, 2013; for PCT Pat. App. No. PCT/US2012/032061; 21 pages.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik,.et al.; "Ultra Low-Power Angular Position Sensor for High-Speed Portable Applications;" 2009 IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with I$^2$C Interface;" Aug. 14, 2008; 9 pages.

MEMSIC Corporation; MMC314xMS; "Ultra Small 3-axis Magnetic Sensor, with I$^2$C Interface;" Mar. 31, 2010; 8 pages.

Micronas GmbH; "HAL® 3625 Programmable Direct Angle Sensor;" Product Information; Sep. 2009; 2 pages.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the

(56) References Cited

OTHER PUBLICATIONS

Miniaturized Circular Vertical Hall Device;" International Solid-State Sensors, Actuators and Microsystems Conference; Transducers; Jun. 21-25, 2009; pp. 877-880.
Blanchard et al.; "Cylindrical Hall Device;" International Electron Devices Meeting; Dec. 8-11, 1996; pp. 541-544.
Burger et al.; "New fully integrated 3-D silicon Hall sensor for precise angular-position measurements;" Sensors and Actuators, A 67; May 1998; pp. 72-76.
Dwyer; Allegro Microsystems, Inc.; "AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The $8^{th}$ International Conference on Solid-State Sensors and Actuators and Eurosensors IX; Jan. 25-29, 1995; pp. 134-137.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.
Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
Novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The $8^{th}$ International Conference on Solid-State Sensors and Acutators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.
SENSIMA technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%Elettrici%20II/Sensori%20e%20trasduttori/Data%20Sheet%20-%202SA-10.pdf; pp. 1-7.
van der Meer; et al; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230.
Response filed Aug. 9, 2013; to Office Action dated Apr. 19, 2013; for U.S. Appl. No. 13/084,745; 26 pages.
Invitation to Pay Additional Fees and, Where Applicable, Protest Fee; PCT/US2012/032061, Date of mailing Sep. 4, 2012, 12 pages.
Banjevic M. et al., "2D CMOS Integrated Magnetometer Based on the Miniaturized Circular Vertical Hall Device", Solid State Sensors, Actuators and Microsystems Conference, 2009, Transducers 2009. International, IEEE, Piscataway, NJ. Jun. 21, 2009, pp. 877-880, XP031545768, ISBN: 978-1-4244-4190-7, pp. 877 and 878.
Pavel, Kejik et al., "Ultra low-power angular position sensor for high speed portable applications", Sensors, 2009, IEEE, IEEE, Piscataway, NJ, USA. Oct. 25, 2009, pp. 173-176, XP031618610, ISBN: 978-1-4244-4548-6, abstract; figures 1,2; section I and II.
Reymond S. et al., "True 2D CMOS Integrated Hall Sensor", Sensors, 2007 IEEE, IEEE, PI, Oct. 28, 2007, pp. 860-863, XP031221197, ISBN: 978-1-4244-1261-7, the whole document.
Petrie; "Circular Vertical Hall Magnetic Field Sensing Element and Method with a Plurality of Continuous Output Signals;" U.S. Appl. No. 13/035,243, filed Feb. 25, 2011; 56 pages.
Donovan et al.; "A Magnetic Field Sensor That Provides an Output Signal Representative of an Angle of Rotation and a Speed of Rotation of a Target Object;" U.S. Appl. No. 13/084,745, filed Apr. 12, 2011; 41 pages.
Melexis MLX 90324; ""Under-the-Hood" Triaxis Rotary Position feat. SENT Protocol;" 3901090324 Data Sheet; Dec. 2008; 40 pages.
Drljaca, et al.; "Nonlinear Effects In Magnetic Angular Position Sensor With Integrated Flux Concentrator;" Proc. $23^{rd}$ International Conference on Microelectronics (MIEL 2002); vol. 1; NIS; Yugoslavia; May 12-15, 2002; pp. 223-226
Office Action; dated Apr. 19, 2013; for U.S. Appl. No. 13/084,745 35 pages.
PCT International Preliminary Report on Patentability and Written Opinion of the ISA; dated Oct. 24, 2013; for PCT Pat. App. No. PCT/US2012/032061; 16 pages.
Notice of Allowance dated Jan. 17, 2004; for U.S. Appl. No. 13/084,745; 10 pages.
Notice of Allowance; dated Oct. 4, 2013; for U.S. Appl. No. 13/084,745; 11 pages.
PCT International Preliminary Report on Patentability and Written Opinion of the ISA dated Mar. 6, 2014; for PCT Pat. App. No. PCT/US2012/049903; 11 pages.
European Written Opinion of EPO dated Feb. 26, 2014; for European Pat. App. No. 12753861.9; 2 pages.

* cited by examiner

CIRCUITS AND METHODS FOR AUTOMATICALLY ADJUSTING A MAGNETIC FIELD SENSOR IN ACCORDANCE WITH A SPEED OF ROTATION SENSED BY THE MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor that can make adjustments to characteristics of circuits within the magnetic field sensor depending upon a sensed speed of rotation of a target object.

BACKGROUND OF THE INVENTION

Magnetic field sensing elements can be used in a variety of applications. In one application, a magnetic field sensing element can be used to detect a direction of a magnetic field, i.e., and angle of the direction of the magnetic field. In another application, a magnetic field sensing element can be used to sense an electrical current. One type of current sensor uses a Hall effect magnetic field sensing element in proximity to a current-carrying conductor.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Like a vertical Hall element, a conventional magnetoresistance element tends to be responsive to magnetic field parallel to a surface of a substrate on which the magnetoresistance element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element is but one element that can provide an output signal representative of an angle of a magnetic field, i.e., an angle sensor. For example, an angle sensor can be provided from a plurality of separate vertical Hall elements or a plurality of magnetoresistance elements.

The magnetic field sensing element, e.g., the CVH sensing element, is limited in a maximum rate at which it can provide signals indicative of the rotational position of the target object. Furthermore, the magnetic field sensing element, e.g., the CVH sensing element, is conventionally operated at one speed, i.e., one sampling rate. Also, generally, power consumption increases at higher sampling rates.

A magnetic field sensor, e.g., a CVH sensing element, is able to achieve a resolution (a number of bits) in a signal representative of the angle of rotation of the target object that decreases with as the rotational speed of the target object increases.

In view of the above, it would be desirable to provide a magnetic field sensor that can adjust certain circuit characteristics within the magnetic field sensor, for example, a sampling rate of the CVH sensing element, as a speed of rotation of the target object increases or decreases, and therefore, the magnetic field sensor can automatically adjust itself to provide characteristics, e.g., resolution, tailored to the speed of rotation of a sensed target object as the target object rotates more rapidly or more slowly.

SUMMARY OF THE INVENTION

The present invention provides a magnetic field sensor that can adjust certain characteristics within the magnetic field sensor, for example, a sampling rate of the CVH sensing element, as a speed of rotation of a target object increases or decreases. Therefore, the magnetic field sensor can automatically adjust itself to provide characteristics, e.g., resolution, tailored to the speed of rotation of the sensed target object as the target object rotates more rapidly or more slowly.

In accordance with one aspect of the present invention, a magnetic field sensor for sensing a position of an object includes a semiconductor substrate having first and second parallel major surfaces. The magnetic field sensor also includes a sensing circuit disposed upon the semiconductor substrate and comprising a plurality of magnetic field sensing elements. The plurality of magnetic field sensing elements is configured to generate a respective plurality of magnetic field sensing element output signals responsive to a magnetic field having a direction component in an x-y plane parallel to the first major surface of the semiconductor substrate. The sensing circuit further comprises one or more sensing circuit programmable circuit elements having a respective one or more sensing circuit programmable characteristics. The magnetic field sensor also includes an x-y direction component circuit disposed upon the semiconductor substrate, coupled to receive a first intermediate signal representative of the plurality of magnetic field sensing element output signals, and configured to generate an x-y angle signal indicative of an angle of the direction component of the magnetic field in the x-y plane. The x-y direction component circuit comprises one or more x-y direction component circuit programmable circuit elements having a respective one or more x-y direction component circuit programmable characteristics. The magnetic field sensor also includes a rotation speed sensing circuit disposed upon the semiconductor substrate, coupled to receive a signal representative of the x-y angle signal, and configured to generate a rotation speed signal indicative of a rotation speed of the object, wherein the rotation speed sensing circuit comprises one or more rotation speed sensing circuit programmable circuit elements having a respective one or more rotation speed sensing circuit programmable characteristics. The magnetic field sensor also includes a processor disposed upon the semiconductor substrate, coupled to receive the rotation speed signal, and configured to generate a module control signal in accordance with a value of the rotation speed signal to program selected ones of the one or more sensing circuit programmable characteristics, the one or more x-y direction component circuit programmable characteristics, or the one or more rotation speed sensing circuit programmable characteristics.

In accordance with another aspect of the present invention, a method used in a magnetic field sensor includes generating, in the magnetic field sensor, a plurality magnetic field sensing element output signals with a corresponding plurality of magnetic field sensing elements disposed upon a semiconductor substrate. The plurality of magnetic field sensing element output signals is responsive to a magnetic field having a direction component in an x-y plane. The method also includes generating, in the magnetic field sensor, an x-y angle signal indicative of an angle of the direction component in the x-y plane in response to a first intermediate signal representative of the plurality of magnetic field sensing element output signals. The method also includes generating, in the magnetic field sensor, a rotation speed signal indicative of a rotation speed of the object in response to a signal representative of the x-y angle signal. The method also includes generating, in the magnetic field sensor, a module control signal to program one or more programmable characteristic of the magnetic field sensor in accordance with a value of the rotation speed signal.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

Vertical Hall elements can be arranged in a so-called circular vertical Hall (CVH) sensing element over a common circular implant region in s substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While a circular vertical Hall (CVH) magnetic field sensing element, which has a plurality of vertical Hall elements, is described in examples below, it should be appreciated that the same or similar techniques and circuits apply to any type of magnetic field sensing element arranged in a manner to detect an angle of a pointing direction of a magnetic field, i.e., a rotation angle of a target object to which a magnet is attached.

Figure 1:
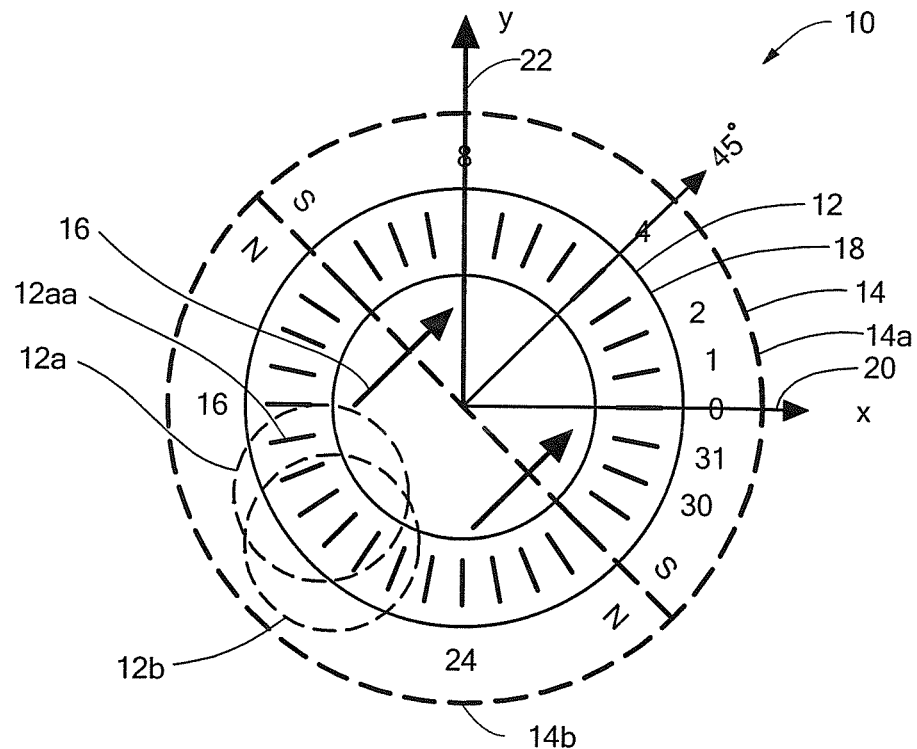
FIG. 1 is a pictorial showing a circular vertical Hall (CVH) sensing element having a plurality of vertical Hall elements arranged in a circle over a common implant region and a two pole magnet disposed proximate to the CVH sensing element.

Referring to FIG. 1, a circular vertical Hall (CVH) sensing element 12 includes a circular implant region 18 in a substrate (not shown). The CVH sensing element 12 has a plurality of vertical Hall elements, of which a vertical Hall element 12a is but one example. Each vertical Hall element has a plurality of Hall element contacts (e.g., four or five contacts). The plurality of vertical Hall element contacts is disposed over the common circular implant region 18. Each vertical Hall element contact can be comprised of a metal contact over a contact diffusion region in the substrate, diffused into the circular implant region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., thirty-two. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts. In some embodiments, described below, the CVH sensing element has sixty-four vertical Hall elements and a corresponding sixty-four vertical Hall element contacts.

In some applications, a circular magnet 14 having a north side 14a and a south side 14b can be disposed over the CVH 12. The circular magnet 14 tends to generate a magnetic field 16 having a direction from the north side 14a to the south side 14b, here shown to be pointed to a direction of about forty-five degrees relative to x-axis 20.

In some applications, the circular magnet 14 is mechanically coupled to a rotating target object, for example, an automobile camshaft or an automobile crankshaft, and is subject to rotation relative to the CVH sensing element 12. With this arrangement, the CVH sensing element 12 in combination with an electronic circuit described below in conjunction with FIG. 3 can generate a signal related to the angle of rotation of the magnet 14, i.e., an angle of rotation of the target object to which the magnet is coupled.

Figure 1A:
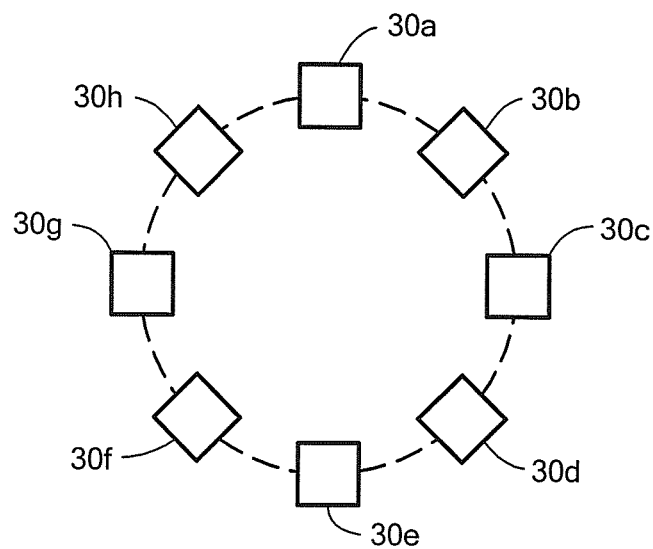
FIG. 1A is a pictorial showing a plurality of other magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements. These elements can be coupled to an electronic circuit the same as or similar to electronic circuit described below in conjunction with FIG. 3. There can also be a magnet the same as or similar to the magnet 14 of FIG. 1 disposed proximate to the magnetic field sensing elements 30a-30h.

Figure 2:
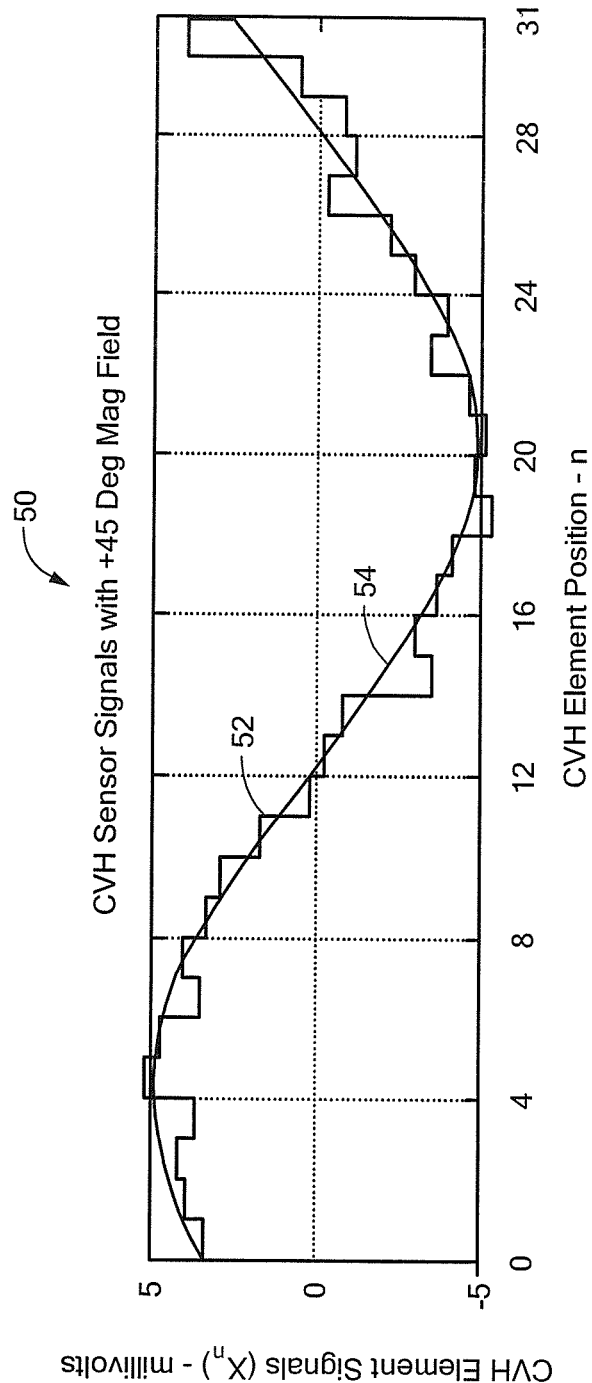
FIG. 2 is a graph showing an output signal as may be generated by the CVH sensing element of FIG. 1 or by the magnetic field sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element.

The graph 50 includes a signal 52 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive peak of the signal 52 is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative peak of the signal 52 is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field. At other angles of the magnetic field 16, peaks and zero crossings of the signal A sine wave 54 is provided to more clearly show ideal behavior of the signal 52. The signal 52 has variations due to vertical Hall element offsets, which tend to somewhat randomly cause element output signals to be too high or too low relative to the sine wave 54, in accordance with offset errors for each element. The offset signal errors are undesirable.

Full operation of the CVH sensing element 12 of FIG. 1 and generation of the signal 52 of FIG. 2 are described in more detail in the above-described PCT Patent Application No. PCT/EP2008056517, entitled "Magnetic Field Sensor for Measuring Direction of a Magnetic Field in a Plane," filed May 28, 2008, which is published in the English language as PCT Publication No. WO 2008/145662, which application is incorporated by reference herein.

As will be understood from PCT Patent Application No. PCT/EP2008056517, groups of contacts of each vertical Hall element can be used in a multiplexed or chopped arrangement to generate chopped output signals from each vertical Hall element. Thereafter, a new group of adjacent vertical Hall element contacts can be selected (i.e., a new vertical Hall element), which can be offset by one element from the prior group. The new group can be used in the multiplexed or chopped arrangement to generate another chopped output signal from the next group, and so on.

Each step of the signal 52 can be representative of a chopped output signal from one respective group of vertical Hall element contacts, i.e., from one respective vertical Hall element. However, in other embodiments, no chopping is performed and each step of the signal 52 is representative of an unchopped output signal from one respective group of vertical Hall element contacts, i.e., from one respective vertical Hall element. Thus, the graph 52 is representative of a CVH output signal with or without the above-described grouping and chopping of vertical Hall elements.

It will be understood that, using techniques described above in PCT Patent Application No. PCT/EP2008056517, a phase of the signal 52 (e.g., a phase of the signal 54) can be found and can be used to identify the pointing direction of the magnetic field 16 of FIG. 1 relative to the CVH 12.

Figure 3A:
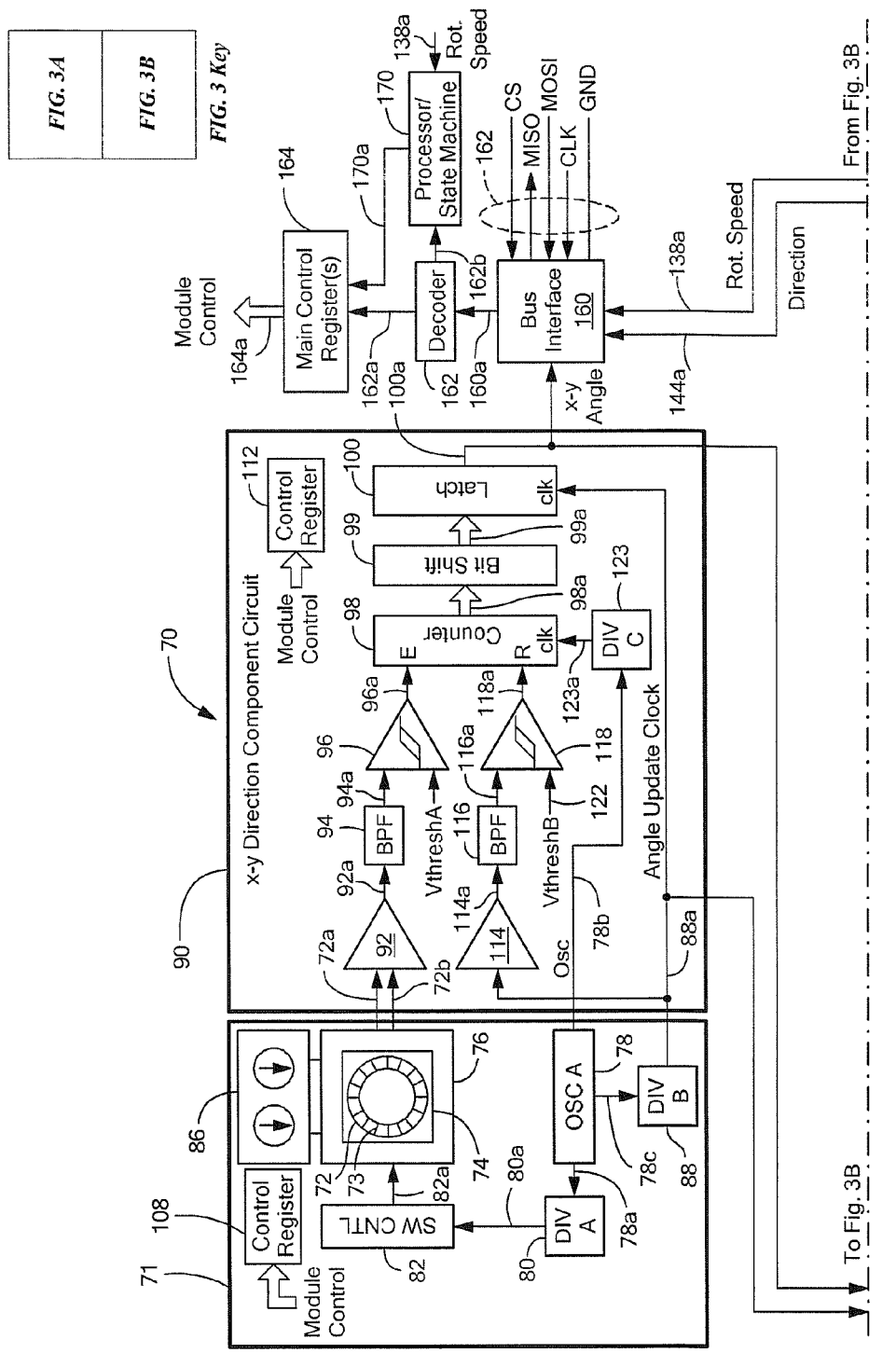
FIG. 3 is a block diagram showing a magnetic field sensor having an angle sensing circuit operable to provide an angle signal representative of an angle of rotation of a target object, a speed sensing circuit operable to provide a speed signal representative of a speed of rotation of the target object, and optionally a direction sensing circuit operable to provide a direction signal representative of a direction of rotation of the target object, with various circuits having characteristics that can be automatically adjusted in accordance with the speed signal.
Figure 3B:
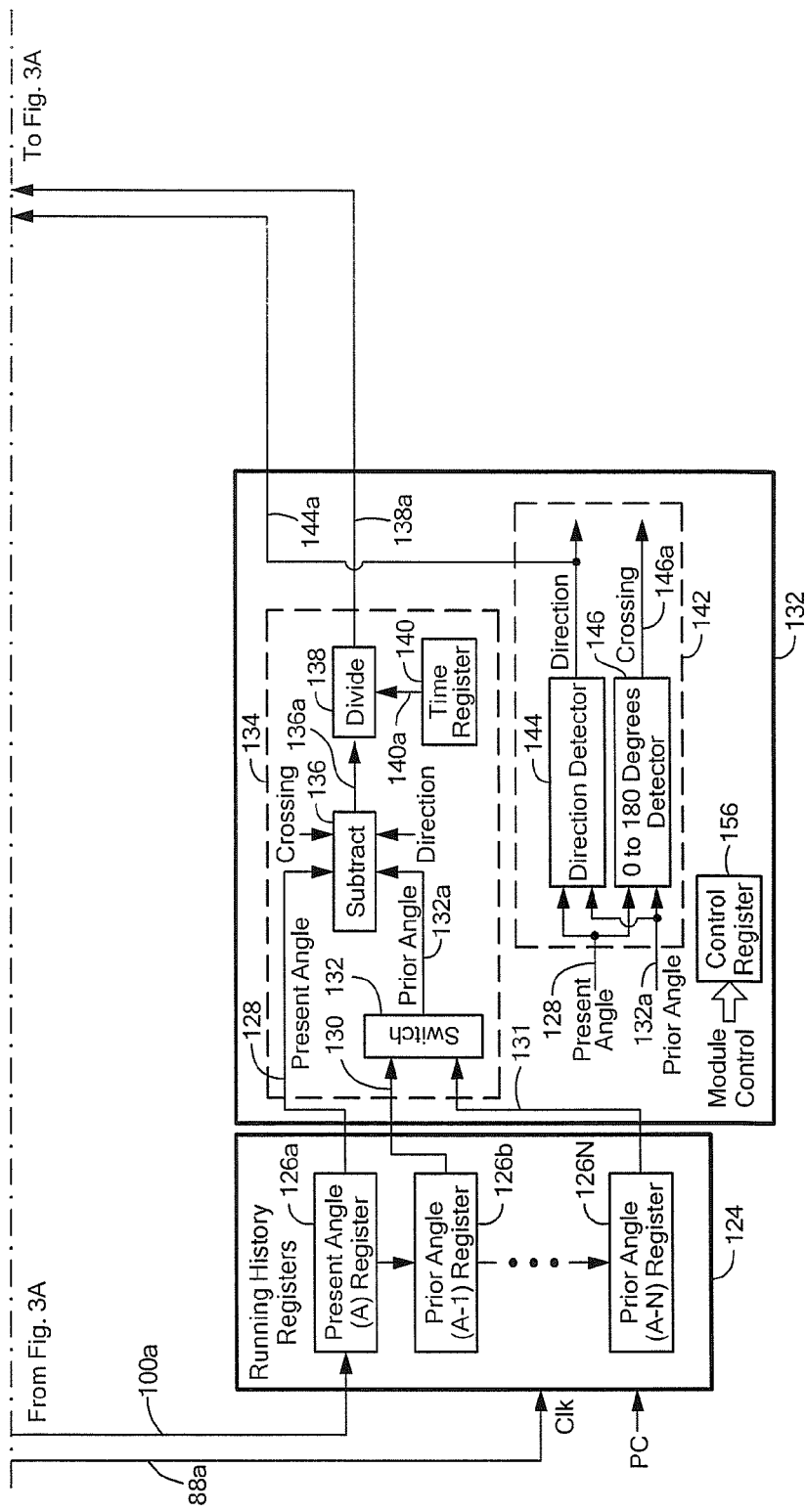

Referring now to FIG. 3, a magnetic field sensor 70 includes a sensing circuit 71 having a CVH sensing element 72 comprising a plurality of vertical Hall elements, each vertical Hall element comprising a group of vertical Hall element contacts (e.g., five vertical Hall element contacts), of which a vertical Hall element contact 73 is but one example. In some embodiments, the CVH sensing element 72 is replaced by a group of magnetic field sensing elements described in conjunction with FIG. 1A.

A magnet (not shown) can be disposed proximate to the CVH sensing element 72, and can be coupled to a target object (not shown). The magnet can be the same as or similar to the magnet 14 of FIG. 1

In some embodiments, a switching circuit 74 can provide a CVH differential output signal 72a, 72b from the CVH sensing element 72.

The CVH differential output signal 72a, 72b is comprised of sequential output signals taken one-at-a-time around the CVH sensing element 72, wherein each output signal is generated on a separate signal path and switched by the switching circuit 74 into the path of the differential output signal 72a, 72b. The signal 52 of FIG. 2 can be representative of the differential signal 72a, 72b. Therefore, the CVH differential output signal 72a, 72b can be represented as a switched set of CVH output signals $x_n = x_0$ to $x_{N-1}$, taken one at a time, where n is equal to a vertical Hall element position (i.e., a position of a group of vertical Hall element contacts that form a vertical Hall element) in the CVH sensing element 72, and where there are N such positions.

In one particular embodiment, the number of vertical Hall elements (each comprising a group of vertical Hall element contacts) in the CVH sensing element 72 is equal to the total number of sensing element positions, N. In other words, the CVH differential output signal 72a, 72b can be comprised of sequential output signals, wherein the CVH differential output signal 72a, 72b is associated with respective ones of the vertical Hall elements in the CVH sensing element 72 as the switching circuit 74 steps around the vertical Hall elements of the CVH sensing element 72 by increments of one, and N equals the number of vertical Hall elements in the CVH sensing element 72. However, in other embodiments, the increments can be by greater than one vertical Hall element, in which case N is less than the number of vertical Hall elements in the CVH sensing element 72.

In one particular embodiment, the CVH sensing element 72 has thirty-two vertical Hall elements, i.e., N=32, and each step is a step of one vertical Hall element contact position (i.e., one vertical Hall element position). However, in other embodiments, there can be more than thirty-two or fewer than thirty-two vertical Hall elements in the CVH sensing element 72, for example sixty-four vertical Hall elements. Also, the increments of vertical Hall element positions, n, can be greater than one vertical Hall element contact.

In some embodiments, another switching circuit 76 can provide the above-described "chopping" of groups of the vertical Hall elements within the CVH sensing element 72. Chopping will be understood to be an arrangement in which a group of vertical Hall element contacts, for example, five vertical Hall element contacts that form one vertical Hall element, are driven with current sources 86 in a plurality of different connection configurations, and signals are received from the group of vertical Hall element contacts in corresponding different configurations to generate the CVH differential output signal 72a, 72b. Thus, in accordance with each vertical Hall element position, n, there can be a plurality of sequential output signals during the chopping, and then the group increments to a new group, for example, by an increment of one vertical Hall element contact.

The magnetic field sensor 70 includes an oscillator 78 that provides clock signals 78a, 78b, 78c, which can have the same or different frequencies. A divider 80 is coupled to receive the clock signal 78a and configured to generate a divided clock signal 80a. A switch control circuit 82 is coupled to receive the divided clock signal 80a and configured to generate switch control signals 82a, which are received by the switching circuits 74, 76 to control the sequencing around the CVH sensing element 72, and, optionally, to control the chopping of groups of vertical Hall elements within the CVH sensing element 72 in ways described above.

The magnetic field sensor 70 can include a divider 88 coupled to receive the clock signal 78c and configured to generate a divided clock signal 88a, also referred to herein as an "angle update clock" signal.

The magnetic field sensor 70 can include a divider 123 coupled to receive the clock signal 78b and configured to generate a divided clock signal 123a.

One or more control registers 108 can control one or more characteristics of the sensing circuit 71 in ways described more fully below.

The magnetic field sensor 70 also includes an x-y direction component circuit 90. The x-y direction component circuit 90 can include an amplifier 92 coupled to receive the CVH differential output signal 72a, 72b. The amplifier 92 is configured to generate an amplified signal 92a. A bandpass filter 94 is coupled to receive the amplified signal 92a and configured to generate a filtered signal 94a. A comparator 96, with or without hysteresis, is configured to receive the filtered signal 94a. The comparator 96 is also coupled to receive a threshold signal 120. The comparator 96 is configured to generate a thresholded signal 96a generated by comparison of the filtered signal 94a with the threshold signal 120.

The x-y direction component circuit 90 also includes an amplifier 114 coupled to receive the divided clock signal 88a. The amplifier 114 is configured to generate an amplified signal 114 a. A bandpass filter 116 is coupled to receive the amplified signal 114a and configured to generate a filtered signal 116a. A comparator 118, with or without hysteresis, is coupled to receive the filtered signal 116a. The comparator 118 is also coupled to receive a threshold signal 122. The comparator 118 is configured to generate a thresholded signal 118a by comparison of the filtered signal 116a with the threshold signal 122.

It should be understood that the amplifier 114, the bandpass filter 116, and the comparator 118 provide a delay of the divided clock signal 88a in order to match a delay of the circuit channel comprised of the amplifier 92, the bandpass filter 94, and the comparator 96. The matched delays provide phase matching, in particular, during temperature excursions of the magnetic field sensor 70.

A counter 98 can be coupled to receive the thresholded signal 96a at an enable input, to receive the clock signal 123a at a clock input, and to receive the thresholded signal 118a at a reset input.

The counter 98 is configured to generate a phase signal 98a having a count representative of a phase difference between the thresholded signal 96a and the thresholded signal 118a. The phase signal 98a is received by a bit shift circuit 99 configured to bit shift the phase signal 98a to provide a bit-shifted signal 99a, which can be shifted by zero bits, one bit, or more than one bit.

The bit-shifted signal 99a is received by a latch 100 that is latched upon edge of the divided clock signal 88a. The latch 100 is configured to generate a latched signal 100a, also referred to herein as an "x-y direction signal."

It will be apparent that the latched signal 100a is a multi-bit digital signal that has a value representative of a direction of an angle of the magnetic field experience by the CVH sensing element 72, and thus, an angle of the magnet and target object.

In some embodiments, the clock signals 78a 78b 78c each have an initial frequency of about 30 MHz, the divided clock signal 80a has an initial frequency of about 3 MHz, the angle update clock signal 88a has an initial frequency of about 30 kHz, and the divided clock signal 123a has an initial frequency of about 30 MHz. However in other embodiments, the initial frequencies can be higher or lower than these frequencies. In some embodiments, the dividers 80, 88, 123 are programmable by a user in ways described more fully below to generate different initial frequencies.

It will be come apparent from discussion below that divide ratios of the dividers 80, 88, 123, as well as other characteristics of the magnetic field sensor 70, can be automatically set or programmed in accordance with a detected speed of rotation of the target object.

The x-y direction component circuit 90 can also include one or more control registers 112 used to set one or more characteristics of the x-y direction component circuit 90 in ways described more fully below.

The magnetic field sensor 70 can also include running history registers 124. The running history registers 124 can include a set of registers 126a-126N arranged as a multibit shift register. The x-y angle signal 100a can be received by a present angle register 126a and stored as a present angle value. The running history registers 124 can be clocked by the divided clock signal 88a (the angle update clock signal). Thus, with each clock of the divided clock signal 88 a, the present angle value stored in the present angle register 126a is shifted downward through the running history registers 124, becoming a prior angle value, and a new present angle value of the x-y angle signal 100a is stored in the present angle register 126a.

The magnetic field sensor 70 can also include a circuit 132. As described more fully below, the circuit 132 is configured to generate a rotation speed signal 138a indicative of a speed of rotation of the target object, and optionally, a direction signal 144a indicative of a direction of rotation of the target object sensed by the CVH sensing element 72.

To this end, the circuit 132 can include a speed sensing circuit 134. The speed sensing circuit 134 can include a switching circuit 132 coupled to receive one or more of prior angle values from the running history registers 124. The switching circuit 132 can provide a selected prior angle value 132a representative of a rotation angle of the target object at a prior time. The speed sensing circuit 134 can also include subtraction circuit 136. The subtraction circuit 136 is coupled to receive a present angle value 128 from the present angle register 126a. The subtraction circuit 136 is also coupled to receive the selected prior angle value 132a. For reasons described more fully below, the subtraction circuit 136 is also coupled to receive the direction signal 144a and a crossing signal 146a.

The subtraction circuit 136 is operable to subtract the prior angle value 132a from the present angle value 128, the difference being an angle of rotation of the target object between times at which the present angle value 128 and the selected prior angle value 132a were stored. Thus, the subtraction circuit 136 can generate a subtracted signal 136a representative of the angle of rotation of the target object between times at which the present angle value 128 and the selected prior angle value 132a were stored.

The speed sensing circuit 134 can also include a divide circuit 138 coupled to receive the subtracted signal 136a from subtraction circuit 136. A time register 140 can hold a time value and can communicate the time value 140a to the divide circuit 138. The divide circuit 138 can divide the subtracted signal 136a by the time value 140a, resulting in the rotation speed signal 138a. In some embodiments, the divide circuit merely bit shifts the subtracted signal 136a.

It will be understood that, by proper selection of the time value 140a in conjunction with which one of the running history registers 124 is used to generate the selected prior angle value 132a, the rotation speed signal 138 a can have any desired rotation speed units, for example, revolutions per minute (rpm). Operation of the speed sensing circuit 134 is further described in U.S. patent application Ser. No. 13/084,745, filed on Apr. 12, 2011, and entitled "A Magnetic Field Sensor That Provides an Output Signal Representative of an Angle of Rotation and a Speed of Rotation of a Target Object," which is assigned to the assignee of the present invention, and which is incorporated by reference herein in its entirety.

The circuit 132 can also include a direction detector 144 coupled to receive the present angle value 128 and coupled to receive the prior angle value 132a. The direction detector 144 is configured to generate the direction signal 144a representative of a direction of rotation of the target object sensed by the CVH sensing element 72.

It will be understood that the prior angle value 132a can be a value indicative of an angle of rotation of the target object at some previous time during continuous operation. Thus, the direction signal 144a is representative of a direction of rotation of the target object between the times that the present angle value 128 and the prior angle value 132a were taken.

The circuit 132 can also include a zero or one hundred eighty degrees detector 146 coupled to receive the present angle value 128 and coupled to receive the prior angle value 132a.

The zero or 180 degrees detector 146 can generate a crossing signal 146a representative of occurrences of crossings of the rotations of the target object through zero degrees and/or through one hundred eighty degrees that occurred between the times that the present angle value 128 and the prior angle value 132a were taken.

As described above, the subtraction circuit can be coupled to receive the direction signal 144a and the crossing signal 146a. The computation by the subtraction circuit can simply be a difference of the present angle value 128 and the selected prior angle value 132a. However, if, between times of the present angle value 128 and the selected prior angle value 132a, the direction of rotation of the target object changed, then the computation of rotation speed can be altered or voided. Also, if the rotation angle crossed past one hundred eighty or three hundred sixty degrees between times of the present angle value 128 and the selected prior angle value 132a, then the computation of rotation speed can be altered to take the crossing into account, for example, by inverting one of the present angle value or the selected prior angle value before they are subtracted.

A control register 156 can control one or more characteristics of the circuit 132 in ways described more fully below.

The magnetic field sensor 70 can also include a bus interface circuit 160. The bus interface circuit 160 can be coupled to receive the x-y angle signal 100a and the rotation speed signal 138a. Optionally, the bus interface circuit 160 can be coupled to receive the direction signal 144a. All of these signals can be communicated to a user via a buss structure 162.

It will be understood here, that the term "bus" is used to describe either a serial or parallel bus having one conductor or a plurality of conductors.

The bus interface circuit 160 is coupled with the bus interface structure 162 to communicate with another processor (not shown) with a standard format, for example, a SPI format, a SENT format, a PSI5 format or an I2C format. The bus interface structure 162 can communicate the x-y angle signal 100a and the rotation speed signal 138a to the other processor. Optionally, the bus interface circuit 160 can communicate the direction signal 144a and/or the turns count signal 146a to the other processor.

The bus interface circuit 160 can also receive various control data upon the bus interface structure 162. The bus interface circuit 160 can communicate the control data 160a to a decoder circuit 162, which can communicate decoded information 162a to main control registers 164, which can store the decoded control data. The main control registers 164 can communicate a module control signal 164a to the control registers 108, 112, 156 within the various modules described above, to affect characteristics of the modules.

The magnetic fields sensor 70 can also include a processor or state machine 170 coupled to receive the rotation speed signal 138a and configured to generate a control signal 170a coupled to the main control register(s) 164. The processor or state machine 170 can also be coupled to receive a signal 162b from the decoder 162.

With this arrangement, the main control register(s) 164 can be programmed by way of the signal 162a via the bus interface 160 and/or by way of the control signal 170a from the processor state machine 170. In some embodiments, the signal 162b is merely used to turn on or off the processor state machine 170, for example, under the control of a user via the bus interface structure 162.

In operation, the processor or state machine 170 is configured to analyze the rotation speed signal 138a and to generate control values for the main control register(s) 164 that propagate to one or more of the control registers 108, 112, 156, thereby controlling certain characteristics of one or more of the modules 71, 90, 132.

Characteristics of the module 71 that can be controlled can include, but are not limited to, a frequency of the oscillator 78, divide ratios of the dividers 80, 88, and configurations of the switch control circuit 82. Configurations of the switch control circuit 82 can include, but are not limited to, whether to chop or not to chop the CVH sensing element 72 via the switching circuit 76, and selection of a number quantity of vertical Hall elements within the CVH sensing element 72 that are sampled via the switching circuit 74.

Characteristics of the module 90 that can be controlled can include, but are not limited to, center frequencies and/or bandwidths of the bandpass filters, values of the threshold signals 120, 122, a divide ratio of the divider 123, a number of bits to shift with the bit shift circuit 99, and a gain of the amplifier 92.

Characteristics of the module 132 that can be controlled can include, but are not limited to, a selection value provided to the switch 132 to select one of the prior angle registers 126b-126N used to provide the prior angle value 132a, and a time value stored in the time register 140.

In general, it will be understood that, a higher speed of rotation of the target object as represented by the rotation speed signal 138a will result in a desire for one or more of: a higher frequency of the oscillator 78, lower divide ratios of the dividers 80, 88, the selection of a smaller number of vertical Hall elements within the CVH sensing the 72 by the switching circuit 74, a higher center frequency of one of for both of the bandpass filters 94, 118, a higher divide ratio of the divider 123, a larger number of bits that is shifted by the bit shift circuit 99, a higher gain of the amplifier 92, a selection by the switch 132 of a prior angle register further up (less delayed) in the running history registers 124, or a smaller time value stored in the time register 140.

In operation, in accordance with changes in some of the above listed characteristics when the target object is rotating at a higher speed, the x-y angle signal 100a will have a lower resolution, i.e., a smaller number of bits. In this situation, if a higher rotation speed of the target object is detected, the bit shift circuit 99 can adjust the digital values of the x-y angle signal 100a to achieve a predetermined position of a most significant bit, i.e., left justified, digital values. Least significant bits can be filled with zeros.

In some embodiments, the above listed characteristics can be controlled in a nearly continuous way, i.e., having many steps. However, on other embodiments, the above listed characteristics can be controlled to have values in accordance with a small number of particular ranges of the sensed rotational speed signal 138a.

Control operation of the magnetic field sensor 70 is further described below in conjunction with FIGS. 4 and 5. Exemplary values of controlled characteristics are listed below in Table 1.

Figure 4:
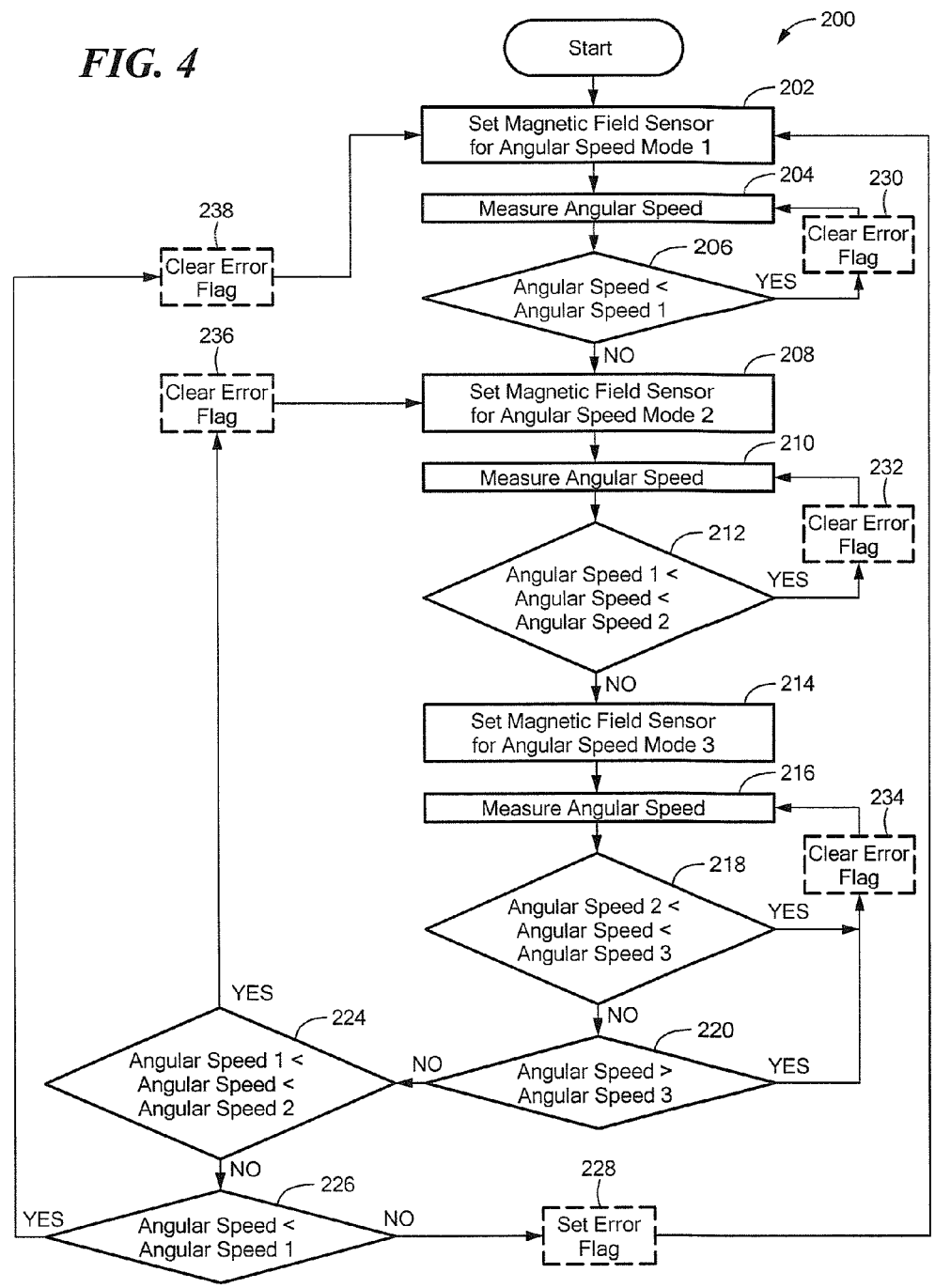
FIG. 4 is a flowchart showing a process that can be used by the magnetic field sensor of FIG. 3.

It should be appreciated that FIG. 4 show a flowchart corresponding to the below contemplated technique which would be implemented in the magnetic field sensor 70 (FIG. 3), for example, within the processor or state machine 170. Rectangular elements (typified by element 208 in FIG. 4), herein denoted "processing blocks," represent computer software instructions or groups of instructions. Diamond shaped elements (typified by element 206 in FIG. 4), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Referring now to FIG. 4 a process 200 can describe operation of the magnetic field sensor 70 of FIG. 3.

The process 200 begins at block 202, where a magnetic field sensor, for example, the magnetic field sensor 70 of FIG. 3 can be initialized, namely, the magnetic field sensor can be set into a first mode having magnetic field sensor characteristics that are appropriate for a first rotation speed of the target object. In the example of FIG. 4, the first mode is a slowest mode of operation of the magnetic field sensor 70 of FIG. 3. However, in other embodiments, the first speed mode can be associated with any absolute or relative rotational speed of the target object. For example in other embodiments, the first speed mode can be a faster speed mode of the magnetic field sensor. In other embodiments, the first speed mode can be an intermediate speed mode of the magnetic field sensor.

At block 204, the angular speed of rotation of the target object is measured, for example by the speed sensing circuit 134 of FIG. 3, to generate measured angular speed values, for example, in the rotation speed signal 138a of FIG. 3.

At block 206, it is determined whether the measured angular speed is less than a first predetermined angular speed. If the angular speed measured at block 204 is not less than the first predetermined angular speed, then the process proceeds to block 208. In other words, if the angular speed measured at block 204 is higher than the first predetermined angular speed, then the magnetic field sensor can be adjusted by steps below, for example, by the processor or state machine 170 of FIG. 3 to enable faster operation of the magnetic field sensor 70.

At block 208, the magnetic field sensor is set for a second angular speed mode suitable for faster speed operation than the first angular speed mode set a block 202.

At block 210, the angular speed is again measured by the magnetic field sensor, and now with the magnetic field sensor configured in the second angular speed mode.

At block 212, the angular speed measured at block 210 is compared with a first predetermined angular speed and a second predetermined angular speed. At block 212 if it is determined that the measured angular speed is not between the first predetermined angular speed and the second predetermined angular speed, then the process proceeds to block 214.

At block 214 the magnetic field sensor is set for a third angular speed mode suitable for even faster speed operation than the second angular speed mode set a block 202.

At block 216, the angular speed is again measured by the magnetic field sensor, but now with the magnetic field sensor configured in the third angular speed mode.

At block 218, the angular speed measured at block 216 is compared with the second predetermined angular speed and a third predetermined angular speed. At block 212 if it is determined that the measured angular speed is not between the second predetermined angular speed and the third predetermined angular speed, then the process proceeds to block 220.

At block 220, the angular speed measured at block 216 is compared with the third predetermined angular speed. If, at block 220, the measured angular speed is not greater than the third predetermined angular speed, then the process proceeds to block 224.

At block 224, the angular speed measured at block 216 is now compared with the first predetermined angular speed and the second predetermined angular speed. If at block 224, the measured angular speed is not between the first predetermined angular speed and the second predetermined angular speed, then the process continues to block 226.

At block 226, the angular speed measured at block 216 is now compared with the first predetermined angular speed. If at block 226, the measured angular speed is not less than the first predetermined angular speed, then the process, in some embodiments, can, at block 228, set an error flag and return back to block 202.

At block 206, if the angular speed measured at block 204 is less than the first predetermined angular speed, then the process, in some embodiments, can, at block 230, clear the error flag and return back to block 204.

At block 212, if the angular speed measured at block 210 is between the first predetermined angular speed in the second predetermined angular speed, then the process, in some embodiments, can, at block 232, clear the error flag and return back to block 210.

At block 218, if the angular speed measured at block 216 is between the second predetermined angular speed and the third predetermined angular speed, then the process, in some embodiments, can, at block 234, clear the error flag and return back to block 216.

At block 220, if the angular speed measured at block 216 is greater than the third predetermined angular speed, then the process, in some embodiments, can, at block 234, clear the error flag and return back to block 216.

At block 224, if the angular speed measured at block 216 is between the first predetermined angular speed and second predetermined angular speed, then the process, in some embodiments, can, at block 236, clear the error flag and return back to block 208.

At block 226, if the angular speed measured at block 216 is less than the first predetermined angular speed, then the process, in some embodiments, can, at block 238, clear the error flag and return back to block 202.

It should be understood that, if the measured angular speed that fits the criteria of block 206, the process can loop at block 206. Similarly, if the measured angular speed fits the criteria of block 212, then the process can loop at block 212. Similarly, if the measured angular speed fits the criteria of blocks 218 or 220, then the process can loop at block 218 or 220.

Any of the above-described loops result in the magnetic field sensor maintaining a particular one of angular speed mode one, angular speed mode to, or angular speed mode three.

The process 200 will be understood to begin at block 202 at a slowest angular speed mode. In other embodiments, a similar process can instead begin in the fastest angular speed mode. In still other embodiments a similar process and instead begin in an intermediate angular speed mode.

While three angular speed modes of operation are shown, in other embodiments, there can be more than three or fewer than three angular speed modes of operation. It will be understood how to modify the process 200 to accommodate more than three or fewer than three angular speed modes of operation.

In some embodiments, when in angular speed mode one, angular speed mode two, and angular mode speed three, the magnetic field sensor, for example, the magnetic field sensor 70 of FIG. 3, can have characteristics listed below in Table 1. The characteristics listed below in conjunction with Table 1 presume that the CVH sensing element, for example, the CVH sensing element 72 of FIG. 3, has 64 vertical Hall elements.

TABLE 1

| Characteristic | FIG. 3 Reference des. | Mode One | Mode Two | Mode Three |
|---|---|---|---|---|
| Oscillator frequency | 78 | 40.96 MHz | 40.96 MHz | 40.96 MHz |
| Divide ratio | 80 | 32 | 4 | 2 |
| Divide ratio | 88 | 8192 | 1024 | 512 |
| Chopping (y or n) | 76 | y | y | y |
| Selected number of vertical Hall elements out of 64 | 74 | 64 | 64 | 32 |
| Number of rotations around | n/a | 4 | 4 | 4 |

TABLE 1-continued

| Characteristic | FIG. 3 Reference des. | Mode One | Mode Two | Mode Three |
|---|---|---|---|---|
| CVH per angle update | | | | |
| Bandpass filter center frequency | 94 | 5 kHz | 40 KHz | 80 kHz |
| Bandpass filter center frequency | 116 | 5 kHz | 40 KHz | 40 KHz |
| Divide ratio | 123 | 1 | 1 | 1 |
| Bit shift | 99 | 0 | 2 | 4 |
| Resolution (bits) | | 12 | 10 | 8 |
| Speed Range | | 0-500 rpm | 500-7000 rpm | 7000-14,000 rpm |

Figure 5:
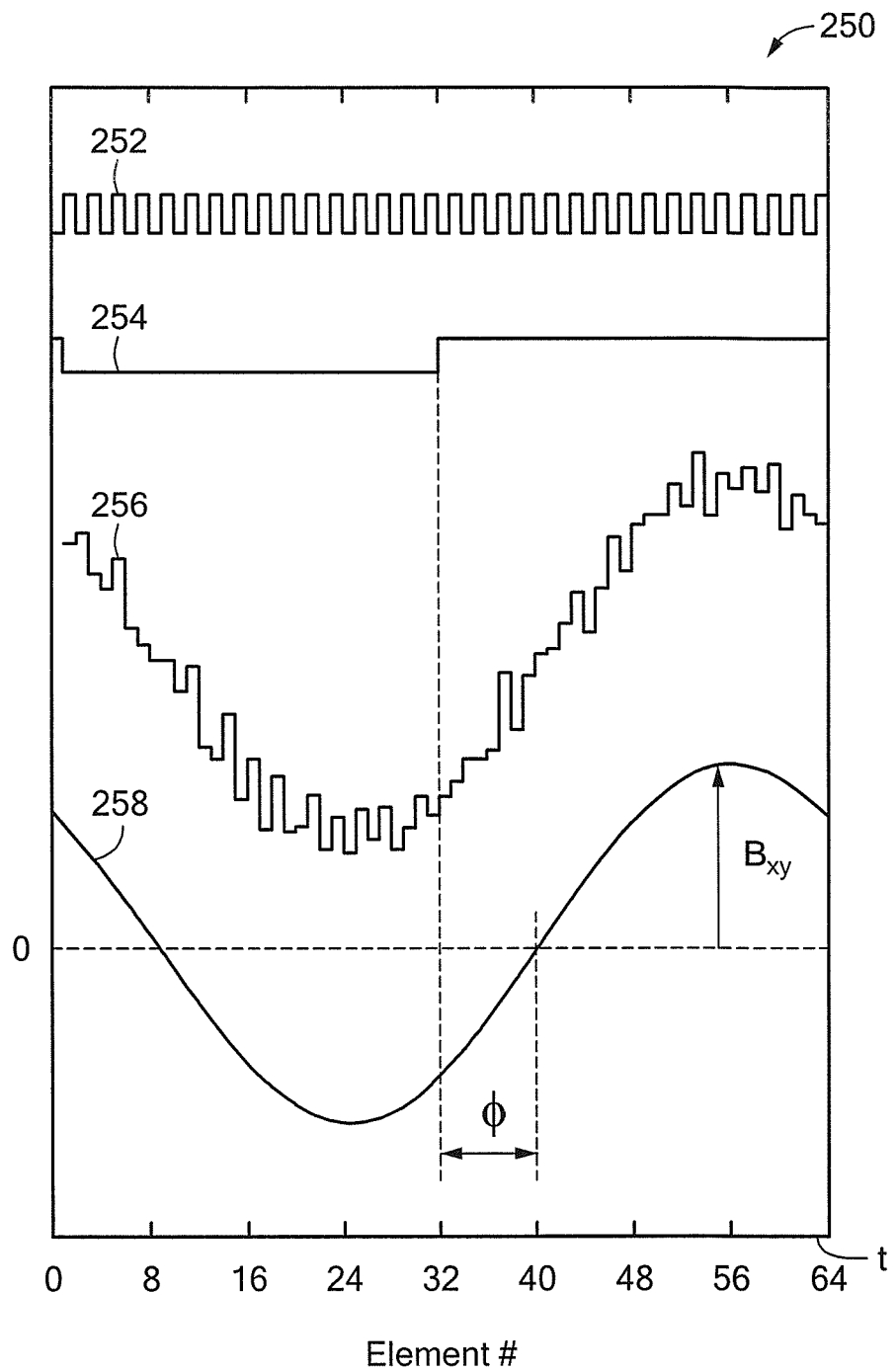
FIG. 5 is a graph showing some exemplary signals within the magnetic field sensor of FIG. 3.

Referring now to FIG. 5, a graph 250 has a horizontal axis with units representative of a vertical Hall element position around the CVH sensing element 72 of FIG. 3. In one exemplary embodiment, there can be sixty-four vertical Hall element contacts in the CVH sensing element 72 and a corresponding sixty-four vertical Hall elements in the CVH sensing element 72.

The graph 250 also includes a vertical axis having units of volts in four different ranges corresponding to four different signals 252, 254, 256, 258.

The signal 252 is representative of the clock signal 80a of FIG. 3, and is representative of a rate at which vertical Hall elements within the CVH sensing element 72 are sequentially sampled.

The signal 254 is representative of the divided clock signal 88a of FIG. 3. The signal 256 is representative of the amplified signal 92a of FIG. 3. The signal 258 is representative of the filtered signal 94a of FIG. 3.

From the signal 256, it can be seen that different ones of the vertical Hall elements within the CVH sensing element 72 (FIG. 3) provide signals with different amplitudes relative to zero when in the presence of a magnetic field. A maximum negative signal is achieved at vertical Hall element position number 24 and a maximum positive signal is achieved at vertical Hall element position number 56 for a particular direction of magnetic field sensed by the CVH sensing element 72. A phase of the signal 258, i.e., a sensing element position of the maxima and minima, is related to the angle of the direction of a component of the magnetic field experienced by the CVH sensing element 72 in the plane of the CVH sensing element 72 (FIG. 3). Thus, for other angles of the magnetic field, the phase will be different, and the maxima and minima (and also the zero crossings) will be at different vertical Hall element positions.

With regard to the signal 256, the irregular up-and-down excursions of the signal 256 are representative of DC offset signals that vary among the vertical Hall elements of the CVH sensing element 72. The offset voltages are undesirable.

A magnitude $B_{xy}$ of the signal 258 is representative of the magnitude of the component of the magnetic field experienced by the CVH sensing element 72 of FIG. 3 in the plane of the CVH sensing element 104.

It is not shown, but it will be understood, that the divided clock signal 123a of FIG. 3 must be at a substantially higher frequency than the divided clock signal 88a of FIG. 3 (signal 254). In general, a ratio of the frequencies of the divided clock signals 123a, 88a will be related to an ultimate resolution (number of bits) in the x-y angle signal 100a. Thus, a 1024:1 ratio of the frequencies of the two clock signals will result in approximately a ten-bit resolution of the x-y angle signal 100a.

It will also be understood that the counter 98 has a limit corresponding to a highest clock frequency that it can receive. It will also be understood that the faster the magnetic field sensor 70 is operated, the more power it tends to consume.

For a given configuration of the magnetic field sensor 70, as the rotational speed of the nearby magnetic, i.e. target object, increases, the ability of the magnetic field sensor 70 using the CVH sensing element 72 to accurately track the angle position and rotation speed can become compromised for any set of circuit characteristics.

It is desirable to operate the magnetic field sensor 70 as fast as required to achieve a desired resolution, but constrained by the desired operating power and constrained by the maximum frequency of the divided clock signal 123a. In other words, it is desirable to operate the magnetic field sensor 70 such that a frequency of the divided clock signal 80a is as high as desired for the application, but not higher, which can otherwise result in lower resolution and higher power consumption.

In accordance with the method described above in conjunction with FIG. 4, and using values presented above in Table 1, it will be apparent that the ratio between frequencies of the divided clock signals 123a, 88a, 80a can be varied according to a sensed speed of rotation of the target object, the ratio related to an ultimate resolution of the magnetic field sensor 70. Other circuit characteristics of the magnetic field sensor 70 of FIG. 3 can also be varied or changed in accordance with values presented above in Table 1. In this way, the divided clock signal 80a can be maintained at a frequency low enough to result low power but fast enough to properly sense the rotating target object, and the divided clock signal 123a can be maintained below the maximum clock frequency required by the counter 98a, but as high as possible to achieve a best resolution (number of bits).

In general, it is desirable to operate the magnetic field sensor 70 of FIG. 3 fast enough such that the signals 156, 158 achieve a full cycle before the target object being sensed can rotate through very many degrees. For example, in one particular embodiment, the divided clock signal 80a has a frequency of 10.24 MHz, the CVH sensing element 72 has sixty-four vertical Hall elements, and four sampling rotations around the CVH sensing element 72 are used to generate one sensed angle value in order to provide averaging. With this exemplary arrangement, an angle of the target object can be determined in a response time of twenty-five µs.

Using the above-described exemplary twenty-five µs response time of the magnetic field sensor 70, a target object rotating at 22,000 revolutions per minute would rotate only about $9.16 \times 10^{-3}$ revolutions i.e., about three degrees, in 25 µs.

In the above exemplary arrangement, the clock 123a is selected to be as fast as is reasonable, but not so fast that the counter 98 is unable to operate This arrangement will achieve a highest bit resolution. Using a fixed clock 123a of 40.96 MHz as shown above in Table 1, frequencies of the other clocks 80a, 88a can be selected by the dividers 80, 88, respectively, in order to achieve a highest bit resolution.

The above circuits and techniques address this degradation in performance as the angular rotation speed of the magnet or target object increases, by automatically adjusting the magnetic field sensor circuitry appropriately so that accurate angle and speed information can still be provided, but perhaps with less resolution at higher target rotation speeds. In addition, the above circuits and techniques also provide the ability to automatically adjust the magnetic field sensor circuitry appropriately when the rotational speed of the rotating magnet and target object is decreased, so that accurate and high resolution angle and speed information is produced by the magnetic fields sensor at lower target rotation speeds. The adjustments are dynamic, meaning that the adjustments can account for changes in rotation speed of the target object upward and downward and adjust the circuits accordingly.

While the above discussion uses the CVH sensing element 72 as an example, it will be understood that the same or similar circuits and techniques apply to any magnetic field sensing elements, for example, separate vertical Hall elements or separate magnetoresistance elements arranged to provide a sensing of a direction of a magnetic field in a plane.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor for sensing a position of an object, comprising:
    a semiconductor substrate having first and second parallel major surfaces;
    a sensing circuit disposed upon the semiconductor substrate and comprising a plurality of magnetic field sensing elements, wherein the plurality of magnetic field sensing elements configured to generate a respective plurality of magnetic field sensing element output signals responsive to a magnetic field having a direction component in an x-y plane parallel to the first major surface of the semiconductor substrate, wherein the sensing circuit further comprises one or more sensing circuit programmable circuit elements having a respective one or more sensing circuit programmable characteristics;
    an x-y direction component circuit disposed upon the semiconductor substrate, coupled to receive a first intermediate signal representative of the plurality of magnetic field sensing element output signals, and configured to generate an x-y angle signal indicative of an angle of the direction component of the magnetic field in the x-y plane, wherein the x-y direction component circuit comprises one or more x-y direction component circuit programmable circuit elements having a respective one or more x-y direction component circuit programmable characteristics;
    a rotation speed sensing circuit disposed upon the semiconductor substrate, coupled to receive a signal representative of the x-y angle signal, and configured to generate a rotation speed signal indicative of a rotation speed of the object, wherein the rotation speed sensing circuit comprises one or more rotation speed sensing circuit programmable circuit elements having a respective one or more rotation speed sensing circuit programmable characteristics; and
    a processor disposed upon the semiconductor substrate, coupled to receive the rotation speed signal, and configured to generate a module control signal in accordance with a value of the rotation speed signal to program selected ones of the one or more sensing circuit programmable characteristics, the one or more x-y direction component circuit programmable characteristics, or the one or more rotation speed sensing circuit programmable characteristics.

2. The magnetic field sensor of claim 1, wherein the plurality of magnetic field sensing elements is arranged as a circular vertical Hall (CVH) structure, wherein each one of the plurality of magnetic field sensing element is a respective vertical Hall element of the CVH structure arranged upon a common circular implant region upon the semiconductor substrate.

3. The magnetic field sensor of claim 2, further comprising a plurality of memory registers disposed upon the semiconductor substrate, configured to store a present angle value derived from the x-y angle signal at a first time and configured to store a prior angle value derived from the x-y angle signal at a second time prior to the first time.

4. The magnetic field sensor of claim 3, wherein the rotation speed sensing circuit comprises:
    a subtraction circuit coupled to receive the present angle value, coupled to receive the prior angle value, and configured to compute a difference between a value representative of the present angle value and a value representative of the prior angle value to generate a difference value.

5. The magnetic field sensor of claim 4, wherein the rotation speed sensing circuit further comprises:
    a divide circuit coupled to receive the difference value, coupled to receive a time value, and configured to divide the difference value by the time value to generate the rotation speed signal, wherein the one or more rotation speed sensing circuit programmable characteristics comprise at least one of the time value or the second time, and wherein the one or more rotation speed sensing circuit programmable circuit elements are coupled to receive at least one of a value representative of the time value or a value representative of the second time.

6. The magnetic field sensor of claim 2, wherein the x-y direction component processor comprises:
    a bandpass filter coupled to receive a second intermediate signal representative of the plurality of magnetic field sensing element output signals and configured to generate a filtered signal, wherein the bandpass filter has a center frequency and a bandwidth;
    a divide circuit coupled to receive a clock signal and configured to generate a divided clock signal, wherein the divide circuit has a divide ratio; and
    a counting circuit coupled to receive the filtered signal, coupled to receive the divided clock signal, and configured to compare a phase of the divided clock signal with a phase of the filtered signal to provide a signal representative of the x-y angle signal, wherein the one or more x-y direction component circuit programmable characteristics comprise at least one of the, bandwidth, or the divide ratio, and wherein the one or more x-y direction component circuit programmable circuit elements are coupled to receive at least one of a value representative of the center frequency, a value representative of the bandwidth, or a value representative of the divide ratio.

7. The magnetic field sensor of claim 6, wherein the x-y direction component processor further comprises:
a bit shift circuit coupled to receive the signal representative of the x-y angle signal and configured to generate a bit-shifted version of the signal representative of the x-y angle signal shifted by a quantity of bits, wherein the one or more x-y direction component circuit programmable characteristics further comprise the quantity of bits, and wherein the one or more x-y direction component circuit programmable circuit elements are further coupled to receive a value representative of the quantity of bits.

8. The magnetic field sensor of claim 2, wherein the sensing circuit further comprises:
an oscillator configured to generate a clock signal, wherein the oscillator has an oscillator frequency;
a divide circuit coupled to receive the clock signal and configured to generate a divided clock signal, wherein the divide circuit has a divide ratio;
a bias generating circuit; and
a switching circuit coupled to receive the divided clock signal, and coupled between the bias generating circuit and the plurality of vertical Hall elements of the CVH structure, wherein the switching circuit has a switching circuit configuration, wherein the one or more sensing circuit programmable characteristics comprise at least one of the oscillator frequency, the divide ratio, or the switching circuit configuration, wherein the one or more sensing circuit programmable circuit elements are coupled to receive at least one of a value representative of the oscillator frequency, a value representative of the divide ratio, or a value representative of the switching circuit configuration.

9. The magnetic field sensor of claim 2, further comprising:
a bus interface circuit coupled to receive a bus signal and configured to generate a command signal in accordance with the bus signal, wherein the processor is further coupled to receive the command signal and configured to override the rotation speed signal to program the selected ones of the one or more sensing circuit programmable characteristics, the one or more x-y direction component circuit programmable characteristics, or the one or more rotation speed sensing circuit programmable characteristics in accordance with a value of the command signal.

10. The magnetic field sensor of claim 2, wherein each one of the plurality of vertical Hall elements comprises a respective group of vertical Hall element contacts coupled to the sequence switching circuit, wherein the sequence switching circuit is operable to select a first vertical Hall element at a first time and to select a second vertical Hall element at a second different time.

11. The magnetic field sensor of claim 10, further comprising a chopping circuit, wherein each group of vertical Hall element contacts is multiplexed by the chopping circuit, wherein the chopping circuit is operable to couple different ones of the vertical Hall element contacts of each group of the vertical Hall element contacts to receive a respective current at a different time.

12. A method used in a magnetic field sensor, comprising:
generating, in the magnetic field sensor, a plurality of magnetic field sensing element output signals with a corresponding plurality of magnetic field sensing elements disposed upon a semiconductor substrate, wherein the plurality of magnetic field sensing element output signals is responsive to a magnetic field having a direction component in an x-y plane;
generating, in the magnetic field sensor, an x-y angle signal indicative of an angle of the direction component in the x-y plane in response to a first intermediate signal representative of the plurality of magnetic field sensing element output signals;
generating, in the magnetic field sensor, a rotation speed signal indicative of a rotation speed of the object in response to a signal representative of the x-y angle signal; and
generating, in the magnetic field sensor, a module control signal to program one or more programmable characteristic of the magnetic field sensor in accordance with a value of the rotation speed signal, wherein the one or more programmable characteristics comprise one or more of a sampling rate of the plurality of magnetic field sensing element output signals, a quantity of magnetic field sensing elements within the plurality of magnetic field sensing elements, a characteristic of an electronic filter operable to filter a second intermediate signal representative of the plurality of magnetic field sensing element output signals to generate a filtered signal, or a quantity of digital bits of the x-y angle signal.

13. The method of claim 12, wherein the plurality of magnetic field sensing elements is arranged as a circular vertical Hall (CVH) structure, wherein each one of the plurality of magnetic field sensing elements is a respective vertical Hall element of the CVH structure arranged upon a common circular implant region in the first major surface of the semiconductor substrate.

14. The method of claim 13, further comprising:
storing, in the magnetic field sensor, a present angle value derived from the x-y angle signal at a first time; and
storing, in the magnetic field sensor, a prior angle value derived from the x-y angle signal at a second time prior to the first time.

15. The method of claim 14, wherein the generating the rotation speed signal comprises:
computing a difference between a value representative of the present angle value and a value representative of the prior angle value to generate a difference value.

16. The method of claim 15, wherein the generating the rotation speed signal further comprises:
dividing the difference value by a time value to generate the rotation speed signal, wherein the generating the module control signal comprises:
generating, in accordance with a value of the rotation speed signal, at least one of a value representative of the time value or a value representative of the second time at which the prior angle value is stored in order to program at least one of the time value or the second time.

17. The method of claim 13, wherein the generating the x-y angle signal comprises:
filtering the second intermediate signal representative of the plurality of magnetic field sensing element output signals to generate the filtered signal, wherein the filtering has a center frequency and a bandwidth; and
comparing a phase of a clock signal with a phase of the filtered signal to provide a signal representative of the x-y angle signal, wherein the clock signal has a clock frequency, wherein the characteristic of the electronic filter comprises one or more of:

the center frequency, or bandwidth, and wherein the one or more programmable characteristics further comprise the clock frequency.

18. The method of claim 17, wherein the generating the x-y angle signal further comprises:
bit shifting the signal representative of the x-y angle signal to provide a bit-shifted version of the signal representative of the x-y angle signal shifted by a quantity of shifted bits, wherein the one or more programmable characteristics further comprise:
the quantity of shifted bits.

19. The method of claim 13, wherein the generating the plurality magnetic field sensing element output signals comprises:
generating a clock signal, wherein the clock signal has a clock frequency;
generating a divided clock signal from the clock signal, wherein the divide circuit has a divide ratio;
generating a bias signal; and
switching the bias signal to the plurality of vertical Hall elements of the CVH structure to provide an output signal responsive to the magnetic field, wherein the switching has a switching configuration, wherein the one or more programmable characteristics further comprise at least one of:
the oscillator frequency, the divide ratio, or the switching configuration.

20. The method of claim 13, further comprising:
receiving a bus signal;
generating a command signal in accordance with the bus signal, and
overriding the rotation speed signal to program selected ones of the one or more programmable characteristics in accordance with the command signal.

21. The method of claim 13, wherein each one of the plurality of vertical Hall elements comprises a respective group of vertical Hall element contacts, wherein the generating the plurality magnetic field sensing element output signals further comprises:
selecting a first vertical Hall element at a first time and selecting a second vertical Hall element at a second different time.

22. The method of claim 21, wherein the generating the plurality magnetic field sensing element output signals further comprises:
multiplexing each group of vertical Hall element contacts, wherein different ones of the vertical Hall element contacts of each one of the groups of the vertical Hall element contacts is coupled to receive a respective current at a different time.

23. A method used in a magnetic field sensor, comprising:
generating, in the magnetic field sensor, a plurality of magnetic field sensing element output signals with a corresponding plurality of magnetic field sensing elements disposed upon a semiconductor substrate, wherein the plurality of magnetic field sensing element output signals is responsive to a magnetic field having a direction component in an x-y plane;
generating, in the magnetic field sensor, an x-y angle signal indicative of an angle of the direction component in the x-y plane in response to a first intermediate signal representative of the plurality of magnetic field sensing element output signals;
generating, in the magnetic field sensor, a rotation speed signal indicative of a rotation speed of the object in response to a signal representative of the x-y angle signal;
generating, in the magnetic field sensor, a module control signal to program one or more programmable characteristic of the magnetic field sensor in accordance with a value of the rotation speed signal
receiving a bus signal;
generating a command signal in accordance with the bus signal, and
overriding the rotation speed signal to program the selected ones of the one or more sensing circuit programmable characteristics, the one or more x-y direction component circuit programmable characteristics, or the one or more rotation speed sensing circuit programmable characteristics in accordance with the command signal.

24. The method of claim 23, wherein the plurality of magnetic field sensing elements is arranged as a circular vertical Hall (CVH) structure, wherein each one of the plurality of magnetic field sensing elements is a respective vertical Hall element of the CVH structure arranged upon a common circular implant region in the first major surface of the semiconductor substrate.

* * * * *